(12) United States Patent
Davis

(10) Patent No.: US 6,417,727 B1
(45) Date of Patent: Jul. 9, 2002

(54) CIRCUIT FOR AUTOMATICALLY TUNING FILTER CIRCUITS OVER PROCESS, VOLTAGE, AND TEMPERATURE

(75) Inventor: Bradley K. Davis, Fort Collins, CO (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/452,368

(22) Filed: Nov. 30, 1999

(51) Int. Cl.[7] .................................................. H03K 5/00
(52) U.S. Cl. ....................................... 327/553; 327/554
(58) Field of Search ................................. 327/554, 553, 327/552, 558, 556, 557, 559

(56) References Cited

U.S. PATENT DOCUMENTS

| | | | | |
|---|---|---|---|---|
| 5,059,836 A | * | 10/1991 | Lee et al. | 327/557 |
| 5,187,445 A | * | 2/1993 | Jackson | 327/553 |
| 5,416,438 A | * | 5/1995 | Shibata | 327/553 |
| 5,663,675 A | | 9/1997 | O'Shaughnessy | 327/553 |
| 6,055,168 A | * | 4/2000 | Kotowski et al. | 363/60 |

OTHER PUBLICATIONS

Johns and Martin, "*Analog Integrated Circuit Design*", Ch. 13, pp. 492–494, © 1997, John Wiley & Sons, Inc., Canada.
Huelsman and Allen, "*Introduction to the Theory and Design of Active Filters*", pp. 157–162, © 1980, McGraw–Hill, Inc.
Durham, Redman–White, and Hughes, "*Low Distortion VLSI Compatible Self–Tuned Continuous–Time Monolithic Filters*", pp. 333–336, IEEE ISCAS, Section 5–A, Active RC Filters.
Durham and Redman–White, "Integrated Continuous–Time Balanced Filters for 16–b DSP Interfaces", pp. 835–839, 7–93 IEEE Journal of Solid–State Circuits, vol. 28, No. 7, Southhampton, England.
Grebene, "Bipolar and MOS Analog Integrated Circuit Design," pp. 825–879, © 1984, John Wiley & Sons, Inc., Canada.
Durham, Hughes and Redman–White, "Circuit Architectures for High Linearity Monolithic Continuous–Time Filtering", IEEE, Analog and Digital Signal Processing, Sep. 1992, vol. 39, No. 9, New York, NY.

* cited by examiner

*Primary Examiner*—Dinh T. Le
(74) *Attorney, Agent, or Firm*—Peter Zawilski

(57) ABSTRACT

Disclosed are a circuit and a method for automatically tuning a filter circuit to compensate for variations in process, voltage, and temperature. The filter circuit includes one or more N-bit capacitor arrays. The circuit includes calibration circuitry and tuning circuitry. The calibration circuitry includes a resistor and a capacitor array that has at least N capacitors, which are configured to receive N input data bits. Each of the at least N capacitors is associated with an input data bit. The calibration circuitry is configured to integrate an input voltage signal in response to the input data bits to generate an output signal for tuning each of the capacitors. The tuning circuitry is coupled to provide the input data bits to the calibration circuitry for tuning the capacitor array and is configured to sequentially tune the N capacitors in response to the output signal by determining and setting a data bit value for each of the N capacitors. The tuning circuitry provides the tuned data bit value to the associated capacitor for tuning the other remaining capacitors. When all data bits have been tuned, they are provided to the filter circuit to compensate for variations in process, voltage, and temperature.

8 Claims, 7 Drawing Sheets

CIRCUIT FOR AUTOMATICALLY TUNING FILTER CIRCUITS OVER PROCESS, VOLTAGE, AND TEMPERATURE

BACKGROUND OF THE INVENTION

1. Field of the Invention

This invention relates generally to the field of tuning circuits. More particularly, the present invention relates to tuning circuits for tuning filter circuits over process, voltage, and temperature variations.

2. Description of the Related Art

Modern integrated circuit (IC) chips often contain filter circuits to remove unwanted signals. For example, in video signal processing, anti-alias filters are frequently used prior to digitization of a continuous-time analog signal to eliminate unwanted noise components from distorting the baseband signal of interest. The anti-alias filters for video signal processing applications typically contain an array of capacitors having a set of binary weighted capacitor values in parallel with a large fixed portion. The capacitor array is effectively a capacitor digital-to-analog (DAC) for converting digital signals into analog counterparts.

In conventional filters, the capacitor DACs are generally used with one or more resistors in a resistor-capacitor (RC) filter configuration. As is well known in the art, the use of capacitors and resistors on a single chip commonly produces RC product shifts due to variations in process, voltage, and/or temperature. For example, the capacitors and resistors in a filter are typically not fabricated exactly to the specification on a chip due to variations in process inherent during the manufacturing process. Likewise, variations in supply voltages in a chip affect the RC product shifts. Similarly, an IC chip generates heat during operation thereby shifting the RC product value.

As can be appreciated, such variations in RC product adversely affect the performance of the filters. In particular, the active RC filter cut-off frequency inversely follows the RC product of the passive filter elements. Normal variations of the filter resistors and capacitors may result in RC product shifts greater than ±50%. Such shifts in the RC product results in variation of filter cutoff characteristics, thereby leading to unstable and often unpredictable results. To compensate for the RC product shifts caused by variations in process, voltage, and/or temperature, conventional techniques have typically tuned the capacitor DACs in the filters by using complex and costly software and/or hardware.

In view of the foregoing, what is needed is a circuit and a method for automatically tuning RC circuits to provide constant RC characteristics over variations in process, voltage, and temperature.

SUMMARY OF THE INVENTION

Broadly speaking, the present invention fills these needs by providing a circuit and a method for automatically tuning filter circuits to provide constant RC characteristics over variations in process, voltage, and temperature. It should be appreciated that the present invention can be implemented in numerous ways, including as a process, an apparatus, a system, a device, or a method. Several inventive embodiments of the present invention are described below.

In one embodiment, the present invention provides a circuit for tuning a filter circuit to compensate for variations in process, voltage, and temperature. The filter circuit includes one or more N-bit capacitor arrays. The circuit includes calibration circuitry and tuning circuitry. The calibration circuitry includes a resistor and a capacitor array that has at least N capacitors, which are configured to receive N input data bits. The capacitor array preferably includes $2^N$ capacitors, but may have as low as N binary weighted capacitors. Each of the N capacitors is associated with an input data bit. The calibration circuitry is configured to integrate an input voltage signal in response to the input data bits to generate an output signal for tuning each of the capacitors. The tuning circuitry is coupled to provide the input data bits to the calibration circuitry for tuning the capacitor array and is configured to sequentially tune the N capacitors in response to the output signal by determining and setting a data bit value for each of the N capacitors. The tuning circuitry provides the tuned data bit value to the associated capacitor for tuning the other remaining capacitors. When all data bits have been tuned, they are provided to the filter circuit to compensate for variations in process, voltage, and temperature.

In yet another embodiment, the present invention provides a method for compensating for variations in process, voltage, and/or temperature in a circuit having a resistor and one or more N-bit capacitor arrays. The method includes: (a) providing calibration circuitry having an N-bit capacitor array coupled and a resistor, the N-bit capacitor array having a set of capacitors, wherein the set of capacitors has N subsets of capacitors with each subset being associated with an input data bit; (b) providing an input voltage signal and N input data bits to N-bit capacitor array, one input data bit for each of the N subsets of capacitors; (c) integrating the input voltage signal in response to the input data bits to generate an output signal for tuning each of the capacitors; and (d) successively tuning the N subsets of capacitors in response to the output voltage signal by determining and setting a data bit value for each of the N subsets of capacitors, wherein when the data bit has been tuned for the associated subset of capacitors, the tuned data bit value is provided to the associated subset of capacitors for tuning the other remaining subsets of capacitors. The capacitor array preferably includes $2^N$ capacitors, but may have as low as N binary weighted capacitors.

In yet another embodiment, a method is provided for tuning a filter circuit to compensate for variations in process, voltage, and/or temperature. The filter circuit includes a capacitor array, which includes at least N capacitors and is coupled to a resistor. Each of the N capacitors is associated with an input data bit. In this method, an input voltage signal and N input data bits are provided to N-bit capacitor array, one input data bit for each capacitor. The input voltage signal is integrated in response to the input data bits to generate an output signal for tuning each of the capacitors. The N capacitors are successively tuned in response to the output voltage signal by determining and setting a data bit value for each of the N capacitors. When the data bit has been tuned for the associated capacitor, the tuned data bit value is provided to the associated capacitor for tuning the other remaining capacitors.

Preferably, the data bits are successively tuned using a successive approximation method from the most significant bit to the least significant bit. By successively setting the data bits from the most significant to the least significant bits, the voltage range of the integrated output signal is successively narrowed by bisection until the target voltage is reached at the end of the integration time, tref. The tuned data bits thus generated effectively provides constant RC product so that the performance of the filter circuits is substantially independent of process, voltage, and temperature. Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION OF THE PREFERRED EMBODIMENTS

An invention is described for a circuit and a method for automatically tuning filter circuits to provide constant RC characteristics over variations in process, voltage, and temperature. It will be obvious, however, to one skilled in the art, that the present invention may be practiced without some or all of these specific details. In other instances, well known circuits, systems, and process operations have not been described in detail in order not to unnecessarily obscure the present invention.

The present invention provides tuning circuit and method for tuning the cutoff frequency of filter circuits to approach a constant characteristic. The tuning circuit and method of the present invention implement a successive approximation algorithm to determine the optimum setting of capacitor DAC using calibration circuitry. The optimum settings are then provided to the filter circuits to compensate for process, voltage, and temperature variations of the filter resistor and capacitor elements.

Figure 1:
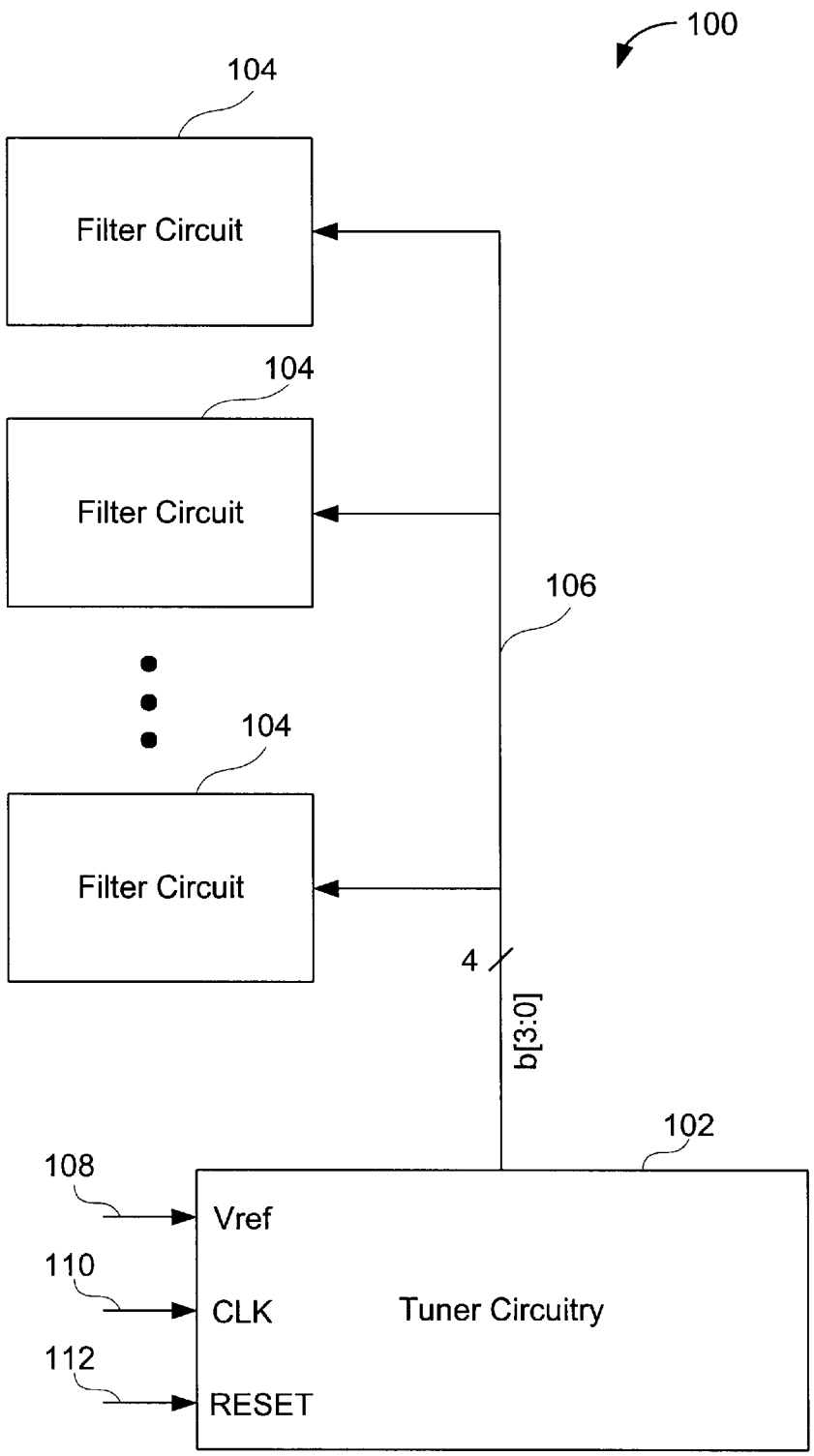
FIG. 1 illustrates tuner circuitry for tuning one or more filter circuits in accordance with one embodiment of the present invention.

FIG. 1 illustrates tuner circuitry 102 for tuning one or more filter circuits 104 in accordance with one embodiment of the present invention. The tuner circuitry 102 receives a reference voltage Vref over a line 108, a clock signal CLK over line 110, and a reset signal RESET on line 112. In response to these signals, the tuner circuitry 102 tunes calibration circuitry (not shown) within the tuner circuitry 102 to generate a tuned data word b[3:0]. The tuner circuitry 102 then provides the tuned data word b[3:0] over a data bus 106 to the filter circuits 104. As will be described in more detail below, the tuned data word b[3:0] is determined and set so as to compensate for variations in process, voltage, and/or temperature.

Figure 2:
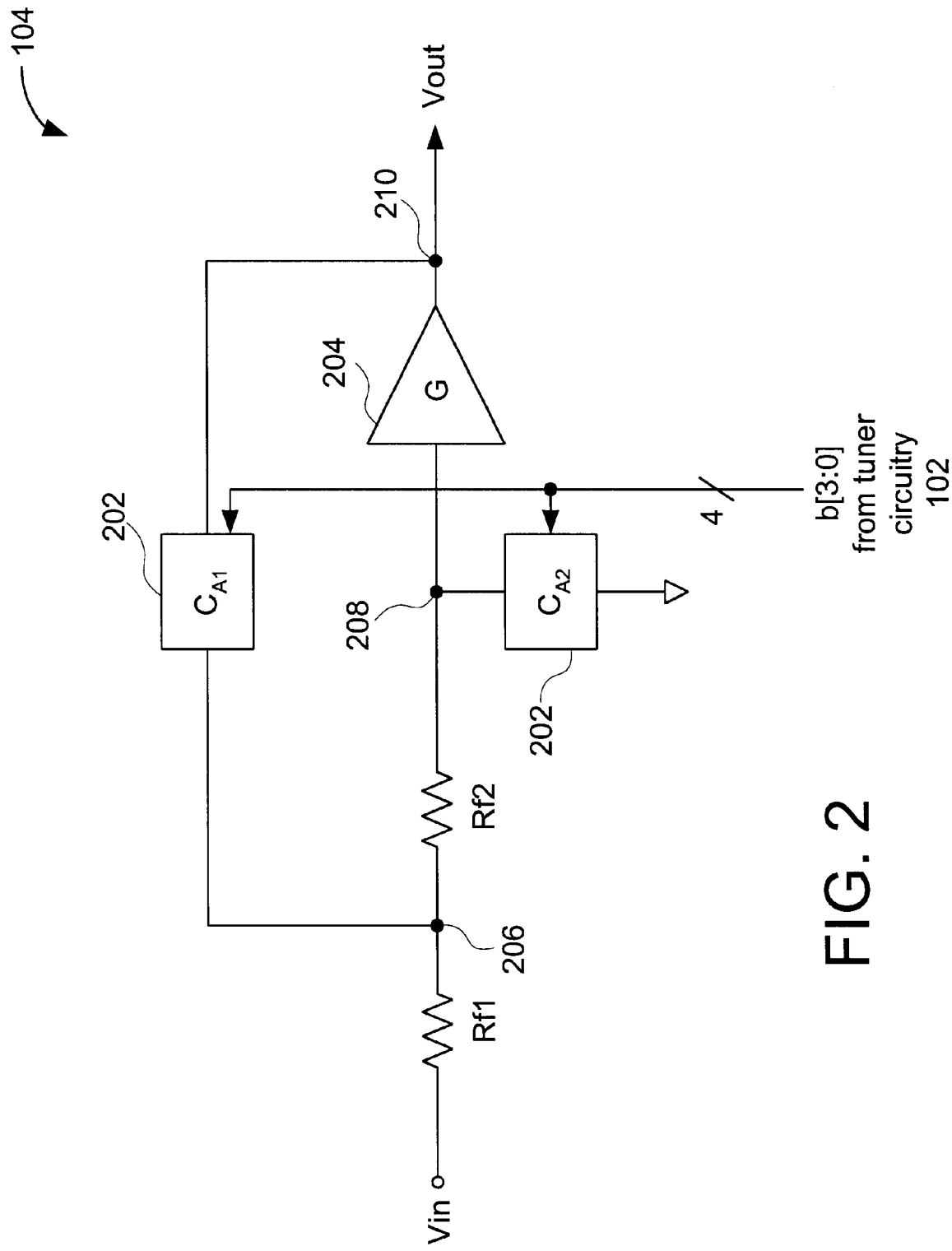
FIG. 2 illustrates a more detailed schematic diagram of a filter circuit in accordance with one embodiment of the present invention.

FIG. 2 illustrates a more detailed schematic diagram of a filter circuit 104 in accordance with one embodiment of the present invention. The filter circuit 104 includes a pair of resistors Rf1 and Rf2, a pair of capacitor arrays 202, and an operational amplifier (op amp) 204. The resistors Rf1 and Rf2 are coupled in series at node 206. The resistor Rf2 is coupled to an input node of the op amp 204 at node 208. The op amp 204 generates an output at an output node 210. Although the filter circuit 104 shown is a low pass filter, the present invention is applied to any suitable types of filter such as high pass, band pass, and all pass filters.

With continuing reference to FIG. 2, one of the capacitor arrays 202 is coupled to nodes 206 and 210 while the other capacitor array 202 is coupled to the input node 208 of the op amp. Both capacitor arrays 202 are coupled to the data bus 106 to receive the tuned data word b[3:0]. Although the present invention is illustrated using data word of 4 bits, it may also employ a data bus of any suitable integer number of bits greater than or equal to one.

In operation, when an input voltage is applied to the resistor Rf1, the filter circuit filters the input voltage Vin to generate a filtered output voltage at the output node 210 in accordance with a transfer function of the filter circuit 104. As will be described in more detail below, the tuning bits of the tuning word b[3:0] applied to the capacitor arrays 202 allows the RC product of the transfer function to be substantially constant over variations in process, voltage, and/or temperature. Since the RC product remains a constant, the transfer function also remain substantially constant as a function of frequency.

In one embodiment, the filter circuit 104 may be described by an s-domain transfer function of a Butterworth Sallen and Key bi-quadratic filter as follows:

$$T(s) = \frac{\frac{K}{(R \cdot C)^2}}{s^2 + s \cdot \frac{K-3}{R \cdot C} + \frac{1}{(R \cdot C)^2}}$$

where K is the gain of the filter and s is equal to $2\pi f \cdot j$. As can be seen, if the RC product remains fixed, so does the filter characteristics and cutoff frequency. Since the RC product of the filter is dependent on process, voltage, and temperature, the cutoff frequency may vary substantially if the RC product is not a constant quantity over the variations. Thus, the cutoff frequency may be constant if the RC product of the filter can be tuned to a constant value by adjusting the capacitance.

Figure 3:
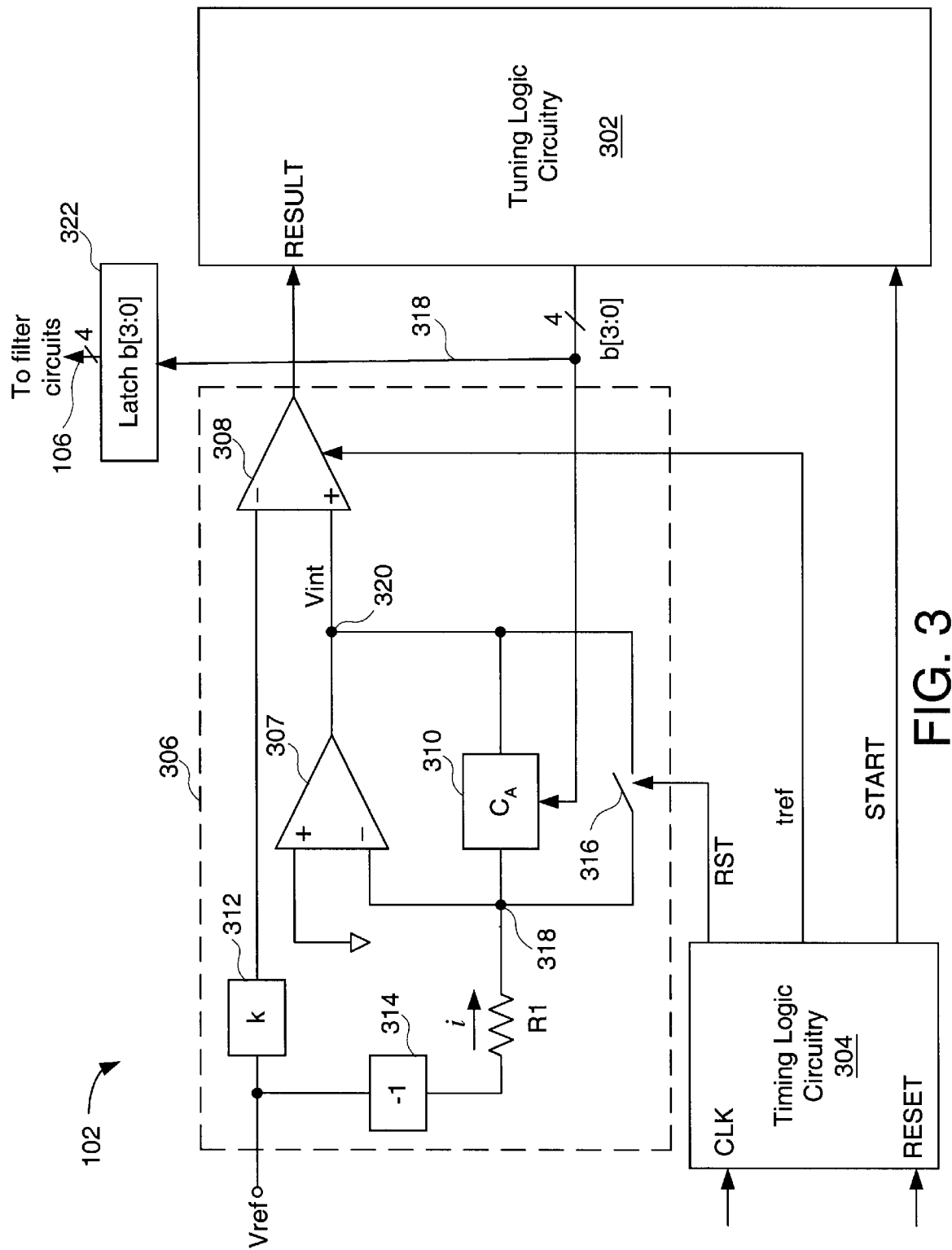
FIG. 3 illustrates a more detailed schematic diagram of the tuner circuitry in accordance with one embodiment of the present invention.

FIG. 3 illustrates a more detailed schematic diagram of the tuner circuitry 102 in accordance with one embodiment of the present invention. The tuner circuitry 102 includes tuning logic circuitry 302, timing logic circuitry 304, and calibration circuitry 306. The timing logic circuitry 304 and the tuning logic circuitry 302 together comprise tuning circuitry for controlling the calibration circuitry 306. The timing logic circuitry 304 receives a clock signal CLK and a reset signal RESET. In response to the CLK and RESET signals, the timing logic circuitry 304 generates another reset signal RST. The reset signal RST is provided to reset the calibration circuitry 306.

In addition, the timing logic circuitry 304 generates a time signal tref and a start signal START. The time signal tref is generated periodically, preferably at an equal time interval, to indicate when to sample a signal. For example, when tref is asserted, the comparator 308 outputs RESULT signal to the tuning logic circuitry 302 for sampling. On the other hand, the START signal is provided to the tuning logic circuitry 302 to indicate the start of tuning operation. The tuning logic circuitry 302 successively provides input data bits to the calibration circuitry 306 for tuning.

With continuing reference to FIG. 3, the calibration circuitry 306 includes an integrator 307, a comparator 308, a capacitor array 310, a resistor R1, a multiplier 312, and an inverter 314. The multiplier 312 is coupled to a negative input port of the comparator 308. The inverter 314 and the resistor R1 are coupled in series. The resistor R1 is coupled to the negative input port of the integrator 307 at a summing node 318. The output of the integrator 307 is coupled to a positive input port of the comparator 308 at node 320. The capacitor array 310 is coupled in parallel to the integrator 307 at nodes 318 and 320. A switch 316 is also coupled to the nodes 318 and 320 and is configured to receive the reset signal RST from the timing logic circuitry 304 for resetting the integrator. The integrator 307 may be implemented using any suitable integrating device such as an operational amplifier.

In this configuration, the capacitor array 310 receives input data bits from the tuning logic circuitry 302 over the data bus 318. As will be described in more detail below, the tuning logic circuitry 302 successively provides the input data bits for sequentially tuning capacitors in the capacitor array 310. In operation, when the reference voltage Vref is applied to an input node 322, the multiplier 312 multiplies the input reference voltage Vref by a constant k to generate another reference voltage kVref for input to the negative input port of the comparator 308.

On the other hand, the inverter 314 receives and inverts the reference voltage Vref, which is then provided to the resistor R1. As can be seen, the current i flowing into the summing node 318 is thus equal to Vref/R1. The integrator 307 integrates the current i as a function of time to generate an integrated output voltage Vint, which is defined as (Vref/RC)*t, where R is the resistance value of the resistor R1, C is the capacitance value of the capacitor array 310, and t is time. The integrated output voltage Vint is then provided to the positive input node of the comparator 308. The comparator 308 compares the input voltages kVref and Vint and generates an output signal RESULT indicating the result of the comparison at time tref. The time tref is preferably an integer number of clock cycles and represents the interaction time. That is, tref is the time from when the integration starts to when the comparator is latched. The clock is a precision reference and sets the slope of Vint as a function of time.

In the illustrated embodiment, the comparator 308 outputs the output signal RESULT in response to the tref signal from the timing logic circuitry 304. The tref signal triggers the comparator 308 to output the RESULT signal to the tuning logic circuitry 302, which sets the input data bits for tuning the capacitor array 310 in response. The reset signal RST from the timing logic circuitry 304 controls the switch 316 so as to reset the integrator 307 upon outputting of the output signal from the comparator 308. At the same time, the tuning logic circuitry provides a next set of input data bits to the capacitor array 310 for tuning the next capacitor. Once all the bits have been tuned, the tuning logic circuitry 302 provides the tuned bit values to a 4-bit latch 322 over the bus 318. The latch 322 stores the tuned data word and provides the data over the data bus 106 to the filter circuits 104.

In one embodiment, it should be appreciated that the output signal RESULT has one of two logical states. That is, if Vint is larger than kVref, then the RESULT is simply a logical "1." However, if Vint is not larger than kVref, then the RESULT is a logic "0." By using the logical signal RESULT to tune a capacitor, the design of the tuning logic circuitry 302 in terms of hardware and software can be substantially simplified.

Figure 4:
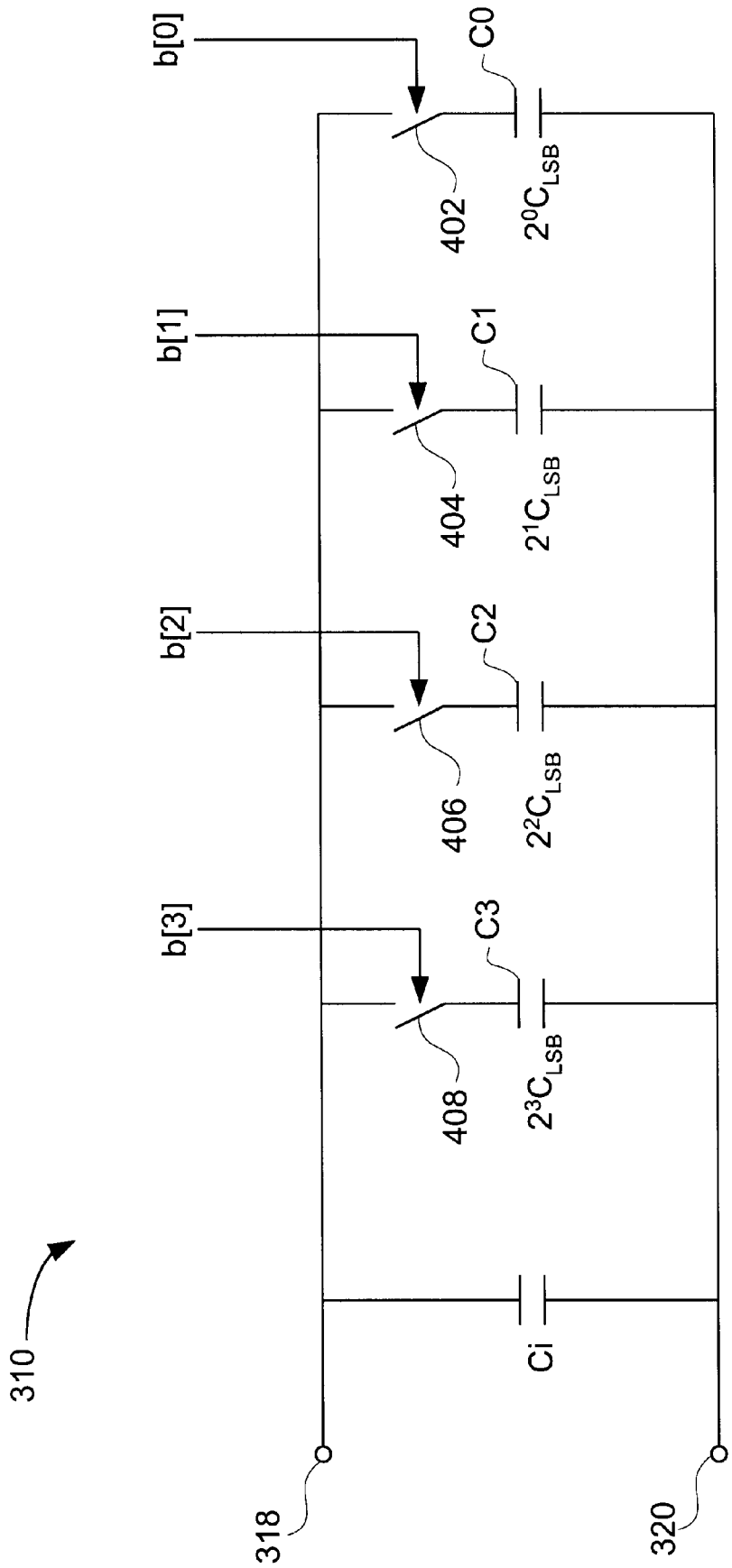
FIG. 4 shows a more detailed circuit diagram of an exemplary capacitor array in accordance with one embodiment of the present invention.

FIG. 4 shows a more detailed circuit diagram of the capacitor array 310 in accordance with one embodiment of the present invention. The capacitor array includes a plurality of capacitors C0, C1, C2, C3, and Ci coupled in parallel across nodes 318 and 320. The four capacitors C0, C1, C2, C3 are binary weighted capacitors representing data bit positions. Each capacitor is associated with and receives an input data bit from the tuning logic circuitry 302. The capacitors C0 through C3 represent a binary data word. For example, the capacitor C0 is associated with the least significant bit position b[0]; the capacitor C1 is associated with the second bit position b[1]; the capacitor C2 is associated with the third bit position b[2]; and the capacitor C3 is associated with the most significant bit b[3]. In one embodiment, the capacitor arrays 202 of the filter circuits 104 have similar capacitor arrangements as the capacitor array 310. In this manner, the tuned bit values for the capacitor array 310 can be used for the capacitor arrays 202 in the filter circuits 104.

For associating each capacitor with a bit position, the capacitors C0, C1, C2, and C3 are characterized by binary weighted capacitance values. In the illustrated embodiment, for example, the capacitor C1 has a capacitance value twice that of the capacitor C0. Similarly, the capacitor C2 has four times the capacitance value of the capacitor C0 or twice the capacitance value of the capacitor C1. Likewise, the capacitor C3 has eight times the capacitance value of the capacitor C0. The capacitor Ci is provided in the capacitor array 310 to provide a fixed capacitance value to narrow the capacitance range of the capacitor array 310. Although the present invention is illustrated using a 4-bit data bus to provide 4 input data bits to the capacitors, those skilled in the art will readily appreciate that it is equally suitable for any number of data bits, data bus and capacitors. For example, eight data bits may be provided for controlling the switches of eight capacitors via an 8-bit data bus.

The capacitors C0, C1, C2, and C3 in the capacitor array 310 are controlled by switches 402, 404, 406, and 408, respectively. The switches 402, 404, 406, 408, in turn, are controlled by input data bits b[0], b[1], b[2], and b[3], respectively, from the tuning logic circuitry. For example, when an input data bit value is zero, the switch is open and the associated capacitor is not active. However, when a bit value is one, the associated capacitor is activated.

In one embodiment, the capacitor array 310 may be implemented using a set of $C_{LSB}$ capacitors. For example, the capacitor C0 can be $2^0$ or one capacitor $C_{LSB}$; the capacitor C1 may be $2^1$ or two $C_{LSB}$ capacitors; the capacitor C2 may be $2^2$ or 4 $C_{LSB}$ capacitors; and the capacitor C3 may be $2^3$ or 8 $C_{LSB}$ capacitors. Alternatively, each of the capacitors C1, C2, and C3 may be a single capacitor corresponding to the assigned capacitance shown in FIG. 4.

Figure 5:
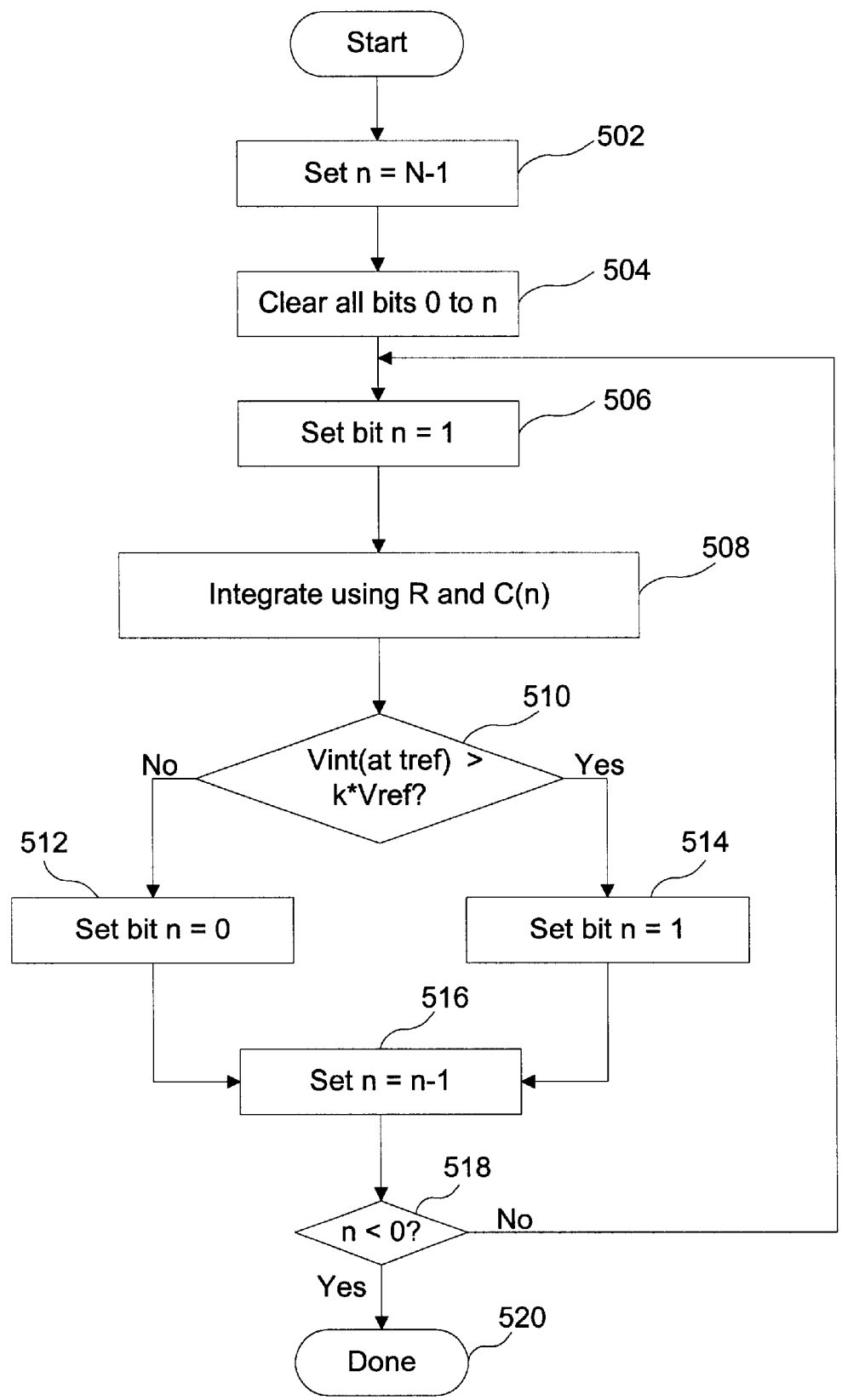
FIG. 5 illustrates an exemplary successive approximation method in accordance with one embodiment of the present invention.

FIG. 5 illustrates an exemplary successive approximation method for tuning the calibration circuitry 306 in accordance with one embodiment of the present invention. In operation 502, an index variable n is set to N−1. This has the effect of setting the index variable n to the most significant bit of the input data bits, namely, 3. Then in operation 504, all data bits 0 to N are cleared by setting all bits b[n:0] to zero. Then, in operation 506, the bit corresponding to the index variable n is set to one for tuning. The setting of the bit corresponding to the index variable n has the effect of selecting and activating the corresponding capacitor in the capacitor array 310. With the selected capacitor so activated, the integrator 307 integrates, in operation 508, the current i in response to the resistance value R of the resistor R1 and the capacitance value of the capacitor array 310.

At time tref, the comparator 308, in operation 510, compares Vint and kVref to determine whether Vint is larger than kVref. If so, the tuning logic circuitry 302 sets bit n to a digital value of "1" in operation 514. Otherwise, the tuning logic circuitry 302 sets bit n to a digital value of "0" in operation 512. Bit n is thus determined and tuned.

After tuning bit n, the index variable n is decremented by one, in operation 516, to select the next bit for tuning. This enables, for example, the selection of the next bit b[2] if bit b[3] has just been tuned. By setting the index variable n to the most significant bit and then decrementing n has the effect of tuning the data bits one by one from the most significant bit b[3] to the least significant bit b[0]. However, it should be noted that the present invention may also be applied by tuning the data bits from the least significant bit to the most significant bit.

Before selecting the next bit, it is determined in operation 518 whether the index variable n is less than zero. If the value of n is not less than zero, this means that one or more data bits still need to be set. In this case, the method proceeds back to operation 506, where the next bit is set to "1" for tuning. However, if the value of n is less than zero, it means that all bits have been tuned. Accordingly, the method terminates in operation 520.

Figure 6:
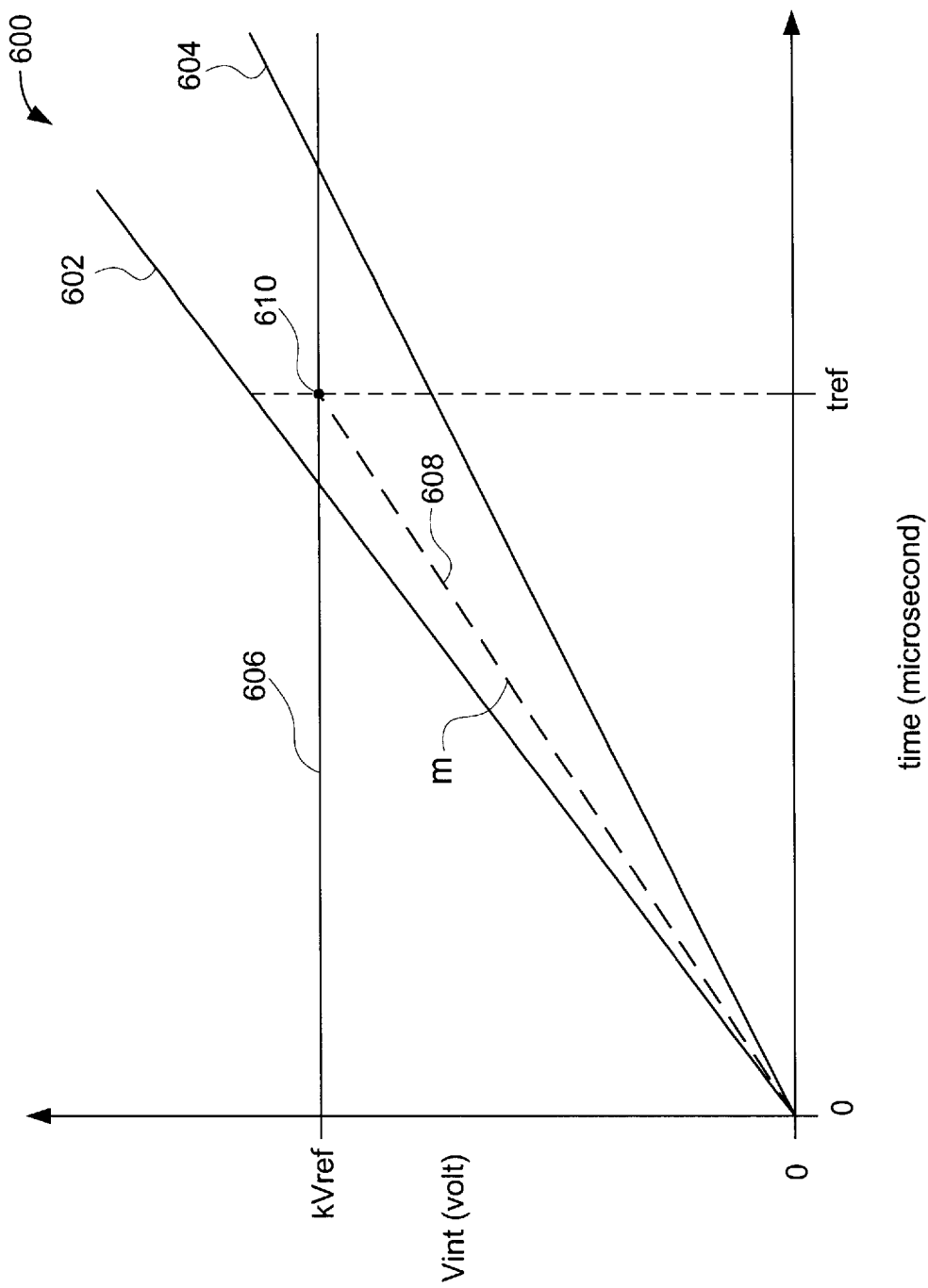
FIG. 6 shows a graph of an exemplary integrated output voltage Vint as a function of time.

As shown in the flowchart of FIG. 5, the tuning of a data bit essentially involves successively performing bisection operations for the data bits corresponding to the capacitors. FIG. 6 shows a graph 600 of an exemplary integrated output voltage Vint as a function of time. The integrator 307 begins integrating at time 0 so that the integrated output voltage Vint ramps up with a slope. The line 608 ending at point 610, where Vint is equal to kVref at time tref represents the target tuning point 610. That is, the target tuning point 610 is where kVref line 606 intersects time tref.

The graph 600 shows two Vint lines 602 and 604. The Vint line 602 represents a case where the slope of Vint line 602 is larger than the target line 608 while the Vint line 604 is where the slope of Vint line 604 is smaller than the target line 608. These two Vint lines 602 and 604 represent an upper limit and a lower limit, respectively of the Vint range. As described above, the comparator 308 compares the Vint value at time tref with the kVref value. When the Vint is larger than kVref as in Vint line 602, it means that the capacitance value of the associated capacitor is too small. Thus, the data bit for the capacitor is set to "1." On the other hand, when the Vint is smaller than kVref as in Vint line 604, this means that the capacitance value of the associated capacitor is too large. Hence, the data bit for the capacitor is set to "0."

By successively setting the data bits from the most significant to the least significant bits, the range of Vint is successively narrowed by bisection until the target point is reached. The tuned data bits thus generated effectively provides constant RC product so that the performance of the filter circuits, to which the tuned data bits are subsequently provided, is substantially independent of process, voltage, and temperature.

The following table 1 shows successive input data bits provided to the capacitors C0, C1, C2, and C3 in the capacitor array 310, where b[n] represents tuned bit value and time represents passes through the loop in the flowchart of FIG. 5.

TABLE 1

| Time | C3 | C2 | C1 | C0 |
|---|---|---|---|---|
| first pass | 1 → Set b[3] | 0 | 0 | 0 |
| second pass | b[3] | 1 → Set b[2] | 0 | 0 |
| third pass | b[3] | b[2] | 1 → Set b[1] | 0 |
| fourth pass | b[3] | b[2] | b[1] | 1 → Set [b0] |

Figure 7:
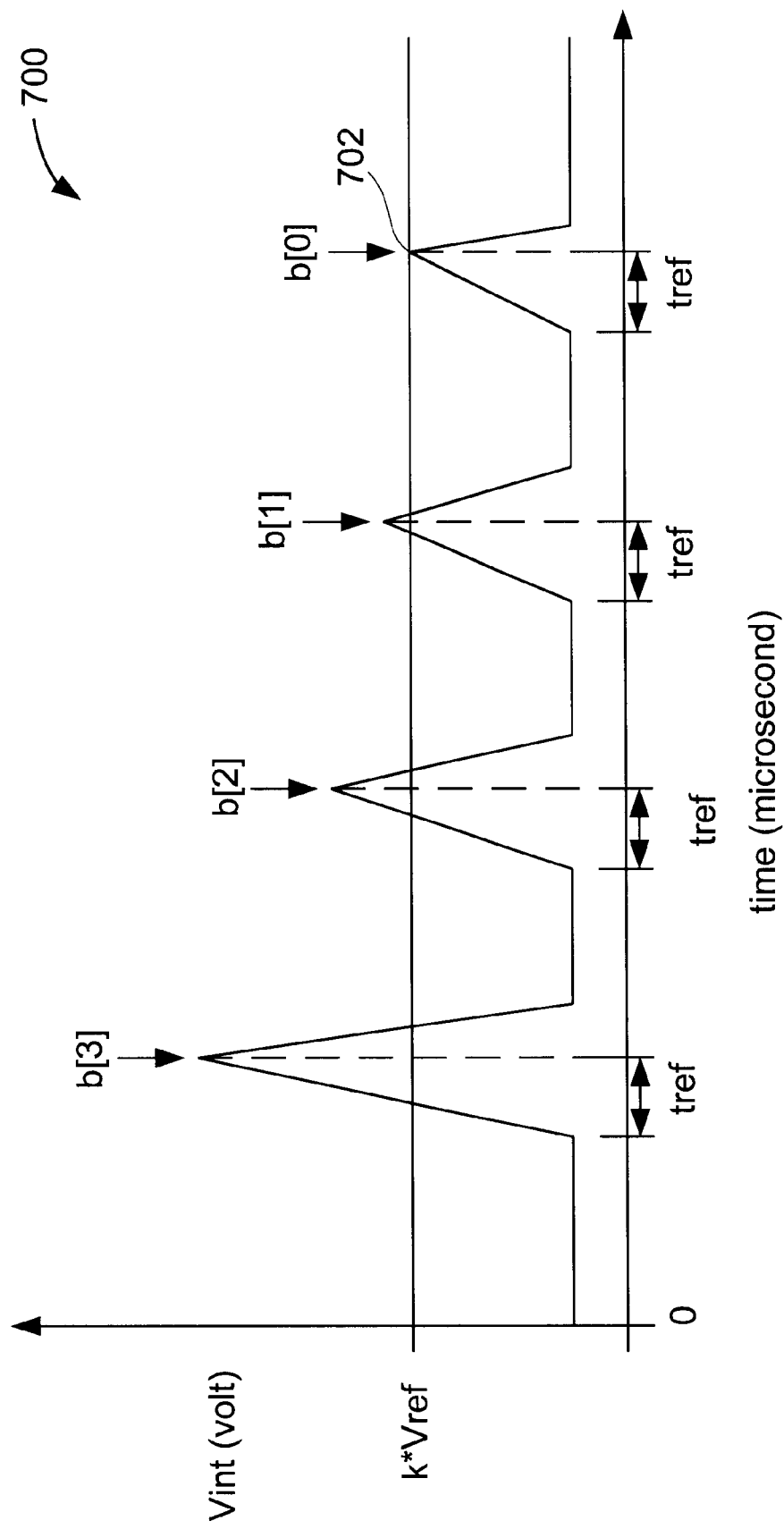
FIG. 7 shows an exemplary graph illustrating the tuning of the data bits b[3:0] at a set of exemplary process, voltage, and temperature.

FIG. 7 shows an exemplary graph 700 illustrating the tuning of the data bits b[3:0] at a set of exemplary process, voltage, and temperature. The time tref is the time interval between the start of integration and the latching of the comparator. At each tref time interval, the integrator output voltage Vint is compared with k*Vref to set a corresponding data bit. As the data bits are successively tuned, the integrated output voltage Vint progressively approaches the tuning point 716 where the Vint is equal to k*Vref. This has the effect of setting the RC to a constant as previously shown in FIG. 6. In this graph, the slope m is proportional to $1/RC=\Delta V/\Delta T=kVref/tref$. The integrator of the tuner sets the slope constant by tuning C so that when the tuning is completed, Vint is equal to kVref at t=tref.

While the present invention has been described in terms of several preferred embodiments, there are alterations, permutations, and equivalents which fall within the scope of this invention. It should also be noted that there are alternative ways of implementing both the method, device, and system of the present invention. It is therefore intended that the following appended claims be interpreted as including all such alterations, permutations, and equivalents as fall within the true spirit and scope of the present invention.

What is claimed is:

1. A circuit for tuning a filter circuit to compensate for variations in manufacturing process, voltage, and/or temperature in the filter circuit, the filter circuit including one or more N-bit capacitor arrays, the circuit comprising:

calibration circuitry including a resistor and a capacitor array that has at least N capacitors, the at least N capacitors in the capacitor array configured to receive N input data bits, each of the at least N capacitors being associated with one of the N input data bits, the calibration circuitry arranged to integrate an input voltage signal in response to the N input data bits to generate an output signal, the calibration circuitry further including an operational amplifier coupled to the resistor and the capacitor array for integrating an input voltage signal to generate an integrated output voltage signal, the input voltage signal being generated from a reference voltage signal, and a comparator coupled to receive and compare the integrated output voltage signal with the reference voltage signal, the comparator generating the output signal that indicates a result of the comparison; and tuning circuitry coupled to provide the N input data bits to the calibration circuitry, the tuning circuitry being configured to sequentially tune the N capacitors in response to the output signal by determining and setting a data bit value for each of the at least N capacitors, wherein the comparator provides the output signal to the tuning circuitry for setting the data bit value for each of the at least N capacitors and the tuning circuitry provides the tuned data bit value to one of the N capacitors associated with the tuned data bit for tuning the other remaining capacitors.

2. The circuit as recited in claim 1, wherein the resistor and the capacitor array defines an RC product and wherein the tuning circuitry generates the tuned data bits for the at least N capacitors so as to provide a constant value for the RC product over the variations in manufacturing process, voltage, and/or temperature.

3. The circuit as recited in claim 1, wherein, the tuning circuitry provides a reference time signal to the calibration circuitry to integrate the input voltage signal for a specified duration and wherein the duration of integration for tuning each of the at least N capacitors is the same.

4. The circuit as recited in claim 1, wherein the tuning circuitry further comprises:

timing logic circuitry for providing first timing signals to the calibration circuitry, the first timing signals including a reset signal for resetting the calibration circuitry and a second timing signal for generating the output signal, wherein the reset and the second timing signals define a timer interval of the integration.

5. The circuit as recited in claim 4, wherein tuning circuitry further comprises:

tuning logic circuitry coupled to provide the input data bits to the capacitor array, the tuning logic circuitry being coupled to receive the output signal from the comparator, wherein the tuning logic circuitry sequentially tunes the at least N capacitors in response to the output signal from the comparator.

6. The circuit as recited in claim 1, wherein the data bits associated with the at least N capacitors represent an N-bit binary word having a most significant bit and a least significant bit and wherein the tuning circuitry successively tunes the data bit values for the N capacitors from the most significant bit to the least significant bit.

7. The circuit as recited in claim 6, wherein the tuning circuitry tunes the data bit values by setting a data bit being tuned to a digital value of "1" when the output signal indicates that the integrated output voltage signal is larger than the reference voltage signal and otherwise setting the data bit being tuned to a digital value of "0."

8. A circuit for tuning a filter circuit to compensate for variation in manufacturing process, voltage, and/or temperature in the filter circuit, the filter circuit including one or more N-bit capacitor arrays, the circuit comprising:

calibration circuitry including a resistor and a capacitor array that has at least N capacitors, the at least N capacitors in the capacitor array configured to receive N input data bits, each of the at least N capacitors being associated with one of the N input data bits, the calibration circuitry arranged to integrate an input voltage signal in response to the N input data bits to generate an output signal, the calibration circuitry further including an operational amplifier coupled to the resistor and the capacitor array for integrating an input voltage signal to generate an integrated output voltage signal, the input voltage signal being generated from a reference voltage signal that has been inverted, and a comparator coupled to receive and compare the integrated output voltage signal with a multiple of the reference voltage signal, the comparator generating the output signal that indicates a result of the comparison; and tuning circuitry coupled to provide the N input data bits to the calibration circuitry, the tuning circuitry being configured to sequentially tune the N capacitors in response to the output signal by determining and setting a data bit value for each of the at least N capacitors, wherein the comparator provides the output signal to the tuning circuitry for setting the data bit value for each of the at least N capacitors and the tuning circuitry provides the tuned data bit value to one of the N capacitors associated with the tuned data bit for tuning the other remaining capacitors.

* * * * *